United States Patent [19]

Bertagnolli

[11] Patent Number: 5,395,775
[45] Date of Patent: Mar. 7, 1995

[54] METHOD FOR MANUFACTURING LATERAL BIPOLAR TRANSISTORS

[75] Inventor: Emmerich Bertagnolli, Munich, Germany

[73] Assignee: Siemens Aktiengesellschaft, Munich, Germany

[21] Appl. No.: 261,151

[22] Filed: Jun. 14, 1994

[30] Foreign Application Priority Data

Jul. 2, 1993 [DE] Germany .................. 43 22 137.8

[51] Int. Cl.[6] ........................................ H01L 21/265
[52] U.S. Cl. ..................... 437/32; 437/917; 437/28; 148/DIG. 10
[58] Field of Search .............. 437/31, 32, 28, 62, 437/917, 909, 33; 148/DIG. 9, DIG. 10

[56] References Cited

U.S. PATENT DOCUMENTS

| | | | |
|---|---|---|---|
| 4,545,113 | 10/1985 | Vora | 437/32 |
| 4,922,315 | 5/1990 | Vu | 257/557 |
| 5,070,030 | 12/1991 | Ikeda et al. | 437/31 |
| 5,073,506 | 12/1991 | Maszara et al. | 437/21 |
| 5,102,812 | 4/1992 | Caneau et al. | 437/32 |
| 5,164,326 | 11/1992 | Foerstner et al. | 437/59 |
| 5,273,915 | 12/1993 | Hwang et al. | 437/60 |

FOREIGN PATENT DOCUMENTS

| | | | |
|---|---|---|---|
| 0253630 | 10/1990 | Japan | 437/31 |
| 0287329 | 10/1992 | Japan | 437/917 |

OTHER PUBLICATIONS

T. Sugii et al., "A New SOI-Lateral Bipolar Transistor for High-Speed Operation", Jap. J. Appl. Phy. 30, L2080–L2082 (1991).

Primary Examiner—Brian E. Hearn
Assistant Examiner—Tuan Nguyen
Attorney, Agent, or Firm—Hill, Steadman & Simpson

[57] ABSTRACT

A method for manufacturing lateral bipolar transistors, whereby a highly doped collector zone is produced in the silicon layer of a SOI substrate provided with a basic doping and using a mask. A structured dielectric layer covering at least this collector zone is then applied. This dielectric layer leaves the region provided for the emitter and the base free. This region left free is re-doped, and an auxiliary layer is then applied surface-wide with a uniform thickness. A doping for an emitter zone is introduced by using this auxiliary layer as shielding for the base zone to be manufactured. Subsequently, the emitter, base and collector are provided with contacts.

9 Claims, 4 Drawing Sheets

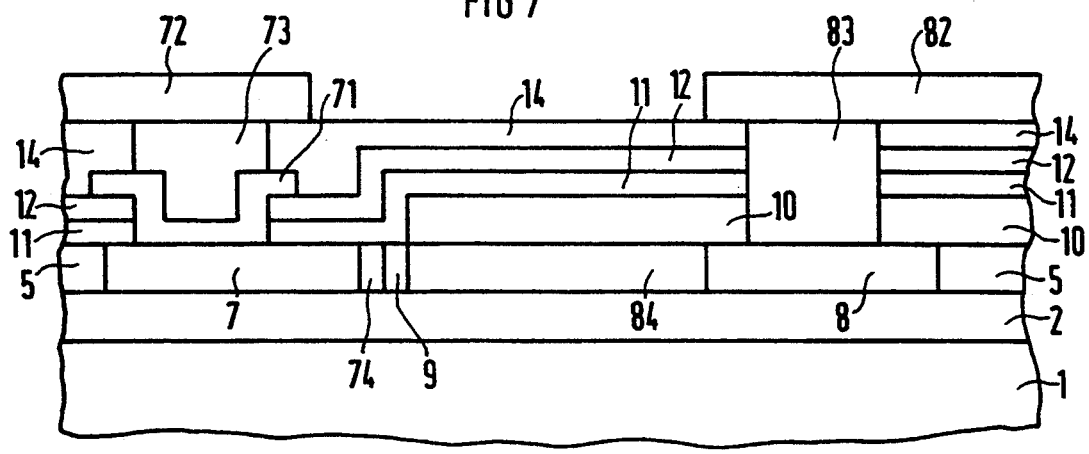
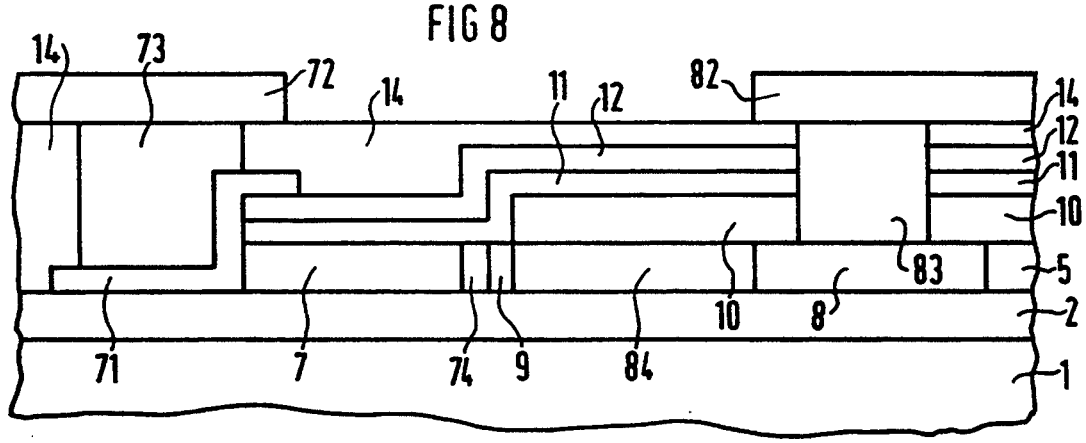
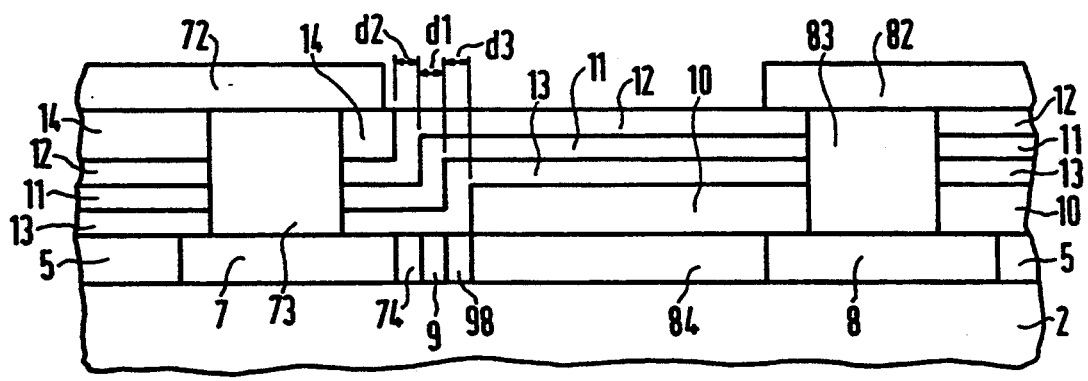

METHOD FOR MANUFACTURING LATERAL BIPOLAR TRANSISTORS

BACKGROUND OF THE INVENTION

1. Field of the Invention

The present invention is directed generally to transistors and more specifically to a method for manufacturing lateral bipolar transistors.

2. Description of the Related Art

Currently, integrated bipolar transistors arc primarily constructed in the form of vertical transistors having npn layers or pnp layers arranged above one another. Given this vertical structure, two layers of this layer sequence are not directly accessible, i.e. from the surface, but must be laterally extended and subsequently conducted up to the surface. A further, highly doped layer is generally necessary for the lowest doped layer in order to keep the conduction to the surface adequately low-impedance.

The disadvantage of this arrangement is that vertical transistors have a noteworthy depth expanse, typically one-two μm, and lateral dimensions that multiply exceed the region claimed by the actual transistor. Correspondingly, there are a number of parasitic capacitances and resistances that, in addition to causing a possible loss in the switching speed, noticeably increase the power consumption above all else.

Also, the complexity of the manufacturing process and the area requirements of these components are extremely high compared to MOS components, thereby leading to low yields and high manufacturing outlays. The simultaneous manufacture of complementary structures (npn and pnp transistors), for example, for analog applications, is only possible with a considerable outlay. A lateral arrangement of a bipolar transistor is usually manufactured such that zones for emitter and collector are produced by locally limited re-doping in a region that is doped for the conductivity type of the base and is also relatively vertically extensive.

SUMMARY OF THE INVENTION

It is an object of the present invention to provide a method for the simplified manufacture of lateral bipolar transistors having an improved structure.

The object of the present invention is inventively achieved in a method for manufacturing a lateral bipolar transistor, having the steps of laterally electrically insulating a region for forming a transistor in a silicon layer located on an insulation layer, the region having a basic doping; manufacturing a highly doped base terminal zone and a highly doped collector zone by implantation of dopants in the silicon layer using masks; applying a structured dielectric layer having a selected thickness over the silicon layer to cover the base terminal zone and to cover a region for forming a collector, leaving free a region provided for a base zone and for an emitter zone, the structured layer having a vertical sidewall relative to a layer plane at a boundary between the covered region and the region left free, the structured layer having a selected thickness; implanting a dopant in the base zone in the silicon layer having a first conductivity type using the dielectric layer as mask; isotropically applying an auxiliary layer surface-wide over the structured dielectric layer with a thickness measured in the direction of emitter to collector that corresponds to the length for the base zone; implanting a dopant in the emitter zone in the silicon layer having a second conductivity type to form a highly doped emitter zone using the auxiliary layer as shielding for the base zone; producing via holes through the auxiliary layer and the dielectric layer respectively exposing the emitter zone, the base terminal zone, and the collector zone; and applying metal electrical contacts in the via holes to the emitter zone, base terminal zone and collector zone.

In the method of the invention, the zones provided for emitter, base and collector are manufactured in a thin silicon layer of, for example, a silicon on insulator (SOI) substrate. As a result thereof, a relatively slight vertical expanse and a simplified manufacturing method derive. The small dimensions of, in particular, the base zone are achieved by using a dielectric layer having a vertical part acting as a mask.

A more detailed description of the method of the present invention with reference to the figures follows.

BRIEF DESCRIPTION OF THE DRAWINGS

FIGS. 6-9 each respectively show cross-sectional views of alternative embodiments of an inventively manufactured, finished transistor of the invention.

DETAILED DESCRIPTION OF THE PREFERRED EMBODIMENTS

The method of the invention utilizes a silicon layer on an insulating foundation or on an insulation intermediate layer. For example, the silicon layer of a SOI substrate can be used. It is of no significance for the method, however, whether material manufactured by wafer bonding or SIMOX material or any other material that has a useful silicon layer on an insulator layer is used as the initial material. An npn or a pnp transistor structure or, for example, one of the following doping sequences can be inventively produced in the silicon layer: $n^+pn^-n^+$ (standard sequence), $n^+npn^-n^+$ (n-buffer layer between base and emitter for reducing breakdown, leakage rates and capacitances), $n^+npn^-nn^+$ ($n^-$ buffer layer between base and collector).

Figure 1:
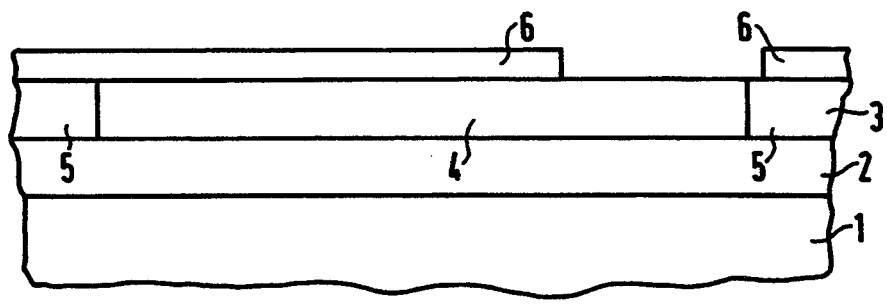
FIGS. 1-3 show a lateral bipolar transistor in cross section after various steps of the manufacturing method of the present invention.

In the exemplary embodiment of FIG. 1, an insulation layer 2 and a silicon layer 3 are present surface-wide on a substrate 1 (for example, silicon). The thickness of the silicon layer 3 can be between 20 nm and 2 μm. The doping level of this layer can be between $10^{15}$ cm$^{-3}$ and $10^{18}$ cm$^{-3}$; donors or acceptors are added dependent on the transistor type. In the exemplary embodiment shown in FIG. 1, the regions of the silicon layer 3 that are provided for the later transistor regions are first defined by using a phototechnique. The silicon layer 3 is provided with a basic doping and the parts of this silicon layer 3 located outside the region provided for the transistor are rendered as insulating. These insulation regions 5 are entered in FIG. 1 in cross section laterally relative to the region 4 wherein the basic doping remains.

On principle, it is also possible to first produce the insulation regions 5 and to subsequently introduce the basic doping into the region of the silicon layer 3 located therebetween. The insulation can occur on the basis of LOCOS, whereby the areas outside of the regions provided for the transistor are oxidized. Instead, a trench can be etched around the region provided for the transistor. A combination of LOCOS and trench etching can also be employed. The oxide then forms what is referred to as the field insulation and a trench extending up to the insulation layer 2 forms the complete dielectric insulation of the transistor toward the outside. It is also conceivable that the silicon regions outside the transistor regions are simply completely etched away, and the transistors thus remain as mesas on the insulation layer 2.

An exemplary embodiment with insulation regions 5 produced by LOCOS is described by way of example in the figures. After the production of the insulation regions 5, the collector zone is first defined by a photolithographically produced mask 6 and is produced by implantation of dopant (for example, As or P in the case of an n-conductive doping). As warranted, the implanted region is subsequently subjected to a curing process and/or diffusion process (for example, RTA/FA processes). The base terminal zone is likewise photolithographically defined by a mask and is produced by implantation of dopant (for example, B in the case of p-conductive doping). Also, as warranted, a curing and/or diffusion step also occurs at this point. In the method of the invention, the sequence of the manufacture of the collector zone and base terminal zone can also be interchanged.

Subsequently, a dielectric layer having, for example, a thickness of 400 nm is deposited. This dielectric layer is subsequently structured by a combination of photolithography and etching such that it overlaps the collector zone to a predetermined distance. As a result thereof, a further collector zone is covered adjoining the collector zone.

Figure 2:
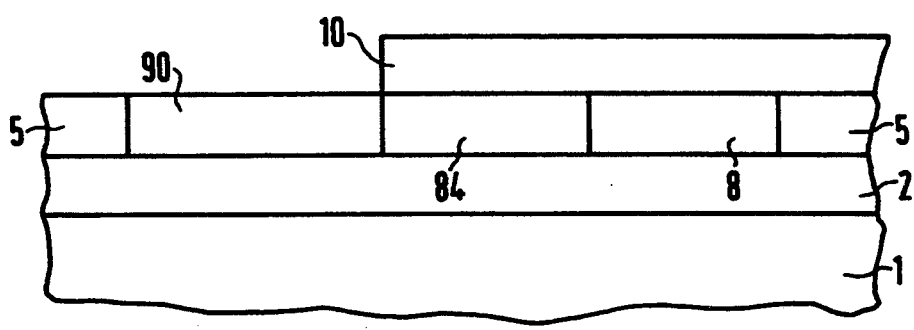

In FIG. 2, this dielectric layer 10 is entered on the collector zone 8 and on the further collector zone 84. This further collector zone 84 provided with the basic doping forms the active collector, whereas the collector zone 8 is highly doped for the contacting. Typical values for the basic doping and, thus, for the level of the doping of this further collector layer 84 lie in the range between $2 \times 10^{16}$ cm$^{-3}$ and $5 \times 10^{17}$ cm$^{-3}$. Important parameters of the transistor are predetermined by the dimensions of the active collector.

An implantation for the doping of the base zone to be produced is introduced into the region left free by the dielectric layer 10. Alternatively to the described method steps, it is possible to first manufacture the base terminal zone in this step together with the base zone. The dose of this implantation for the base zone is set such that the doping in the region not covered by the dielectric layer 10 achieves values between $10^{17}$ cm$^{-3}$ and $10^{19}$ cm$^{-3}$. Typically, $1 \times 10^{18}$ through $5 \times 10^{18}$ cm$^{-3}$ is selected as height of the doping. As warranted, a curing and/or diffusion step (for example 10 seconds at 1000° C.) occurs immediately after the implantation. The emitter-base zone 90 having the doping provided for the base zone results as shown in FIG. 2.

Figure 3:
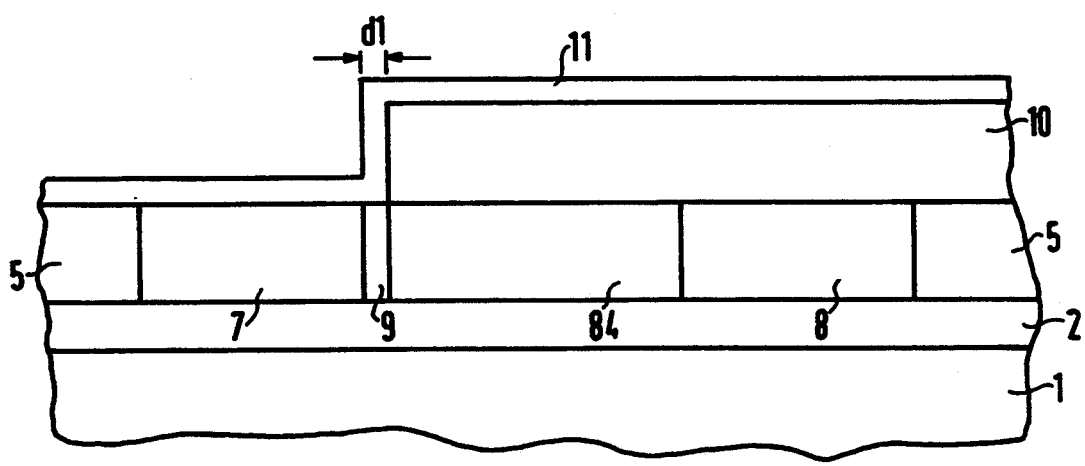

As a critical step in the invention, an auxiliary layer 11 having the thickness d1 is conformally applied surface-wide subsequent thereto in accord with FIG. 3 (for example, with a CVD method). This thickness d1 is selected to be the same size as the base width of the future transistor (i.e., the dimension of the base zone 9 in the direction from emitter to collector) in view of technological tolerances. This auxiliary layer 11 is, for example, advantageously TEOS (tetraethylorthosilicate) that is applied with CVD at approximately 700° C. However, a mixture of SiH$_4$ and NO$_2$ can also be used. The auxiliary layer 11 can be SiO$_2$ or Si$_3$N$_4$ applied in some other way. Upon use of this auxiliary layer 11, a surface-wide implantation is undertaken with dopant for the conductivity type of the emitter zone to be produced. The previously re-doped emitter-base zone 90 is therefore again re-doped. The vertically arranged section of the auxiliary layer 11 shields the base zone 9 against this implantation. The re-doping therefore occurs only in the region of the emitter zone 7 as shown in FIG. 3. The auxiliary layer 11 has only the thickness d1 above this emitter zone 7; this thickness d1 being penetrated by the dopant. The dose of the implantation must be selected to be a size that the base doping previously implanted in this region is compensated and, moreover, the doping of the emitter zone becomes so high that it can be contacted in low-impedance fashion (the height of this doping, for example, is $1 \times 10^{19}$ cm$^{-3}$). As warranted, a curing and/or diffusion step (for example, 10 seconds at 950° C.) immediately follows the implantation.

Figure 4:
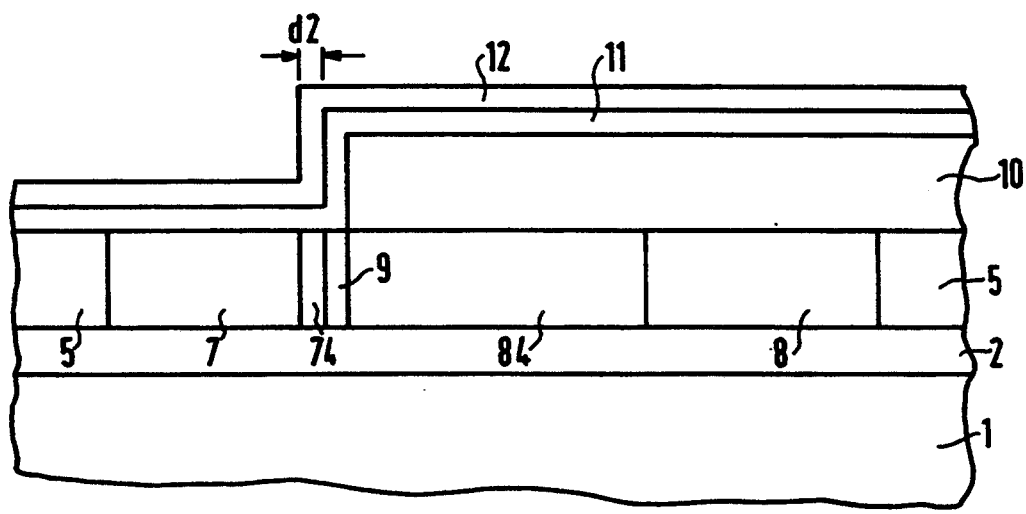
FIG. 4 shows an alternative embodiment produced using the method of the present invention.

In an exemplary embodiment of the method of the invention, a second auxiliary layer 12 is conformally deposited surface-wide according to FIG. 4. The dimension of a lightly doped, further emitter zone 74 is defined with the thickness d2 of this second auxiliary layer 12. The implantation undertaken using only the auxiliary layer 11 then produces the dopant level that is provided for this further emitter zone 74. The high doping provided for the emitter zone 7, which serves the purpose of contacting, is introduced using the second auxiliary layer 12. The zones are respectively cured after the implantation.

Figure 6:
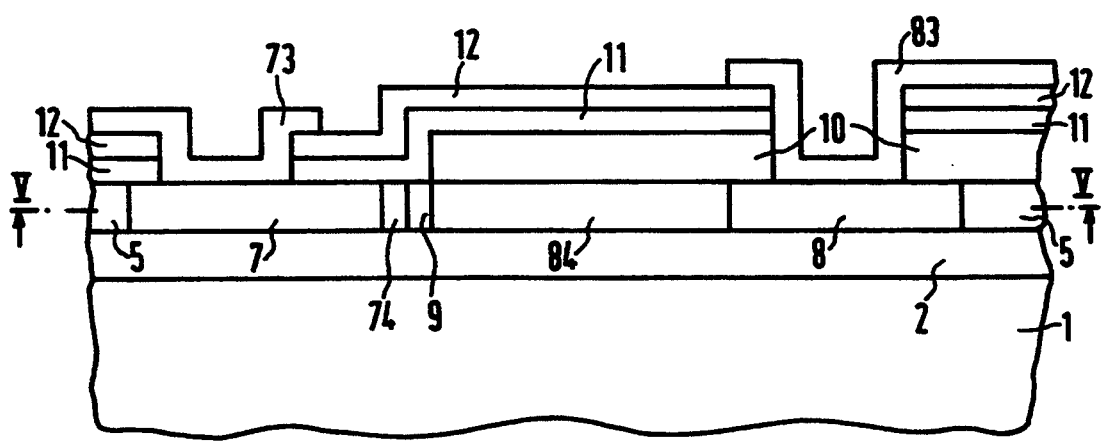
Figure 5:
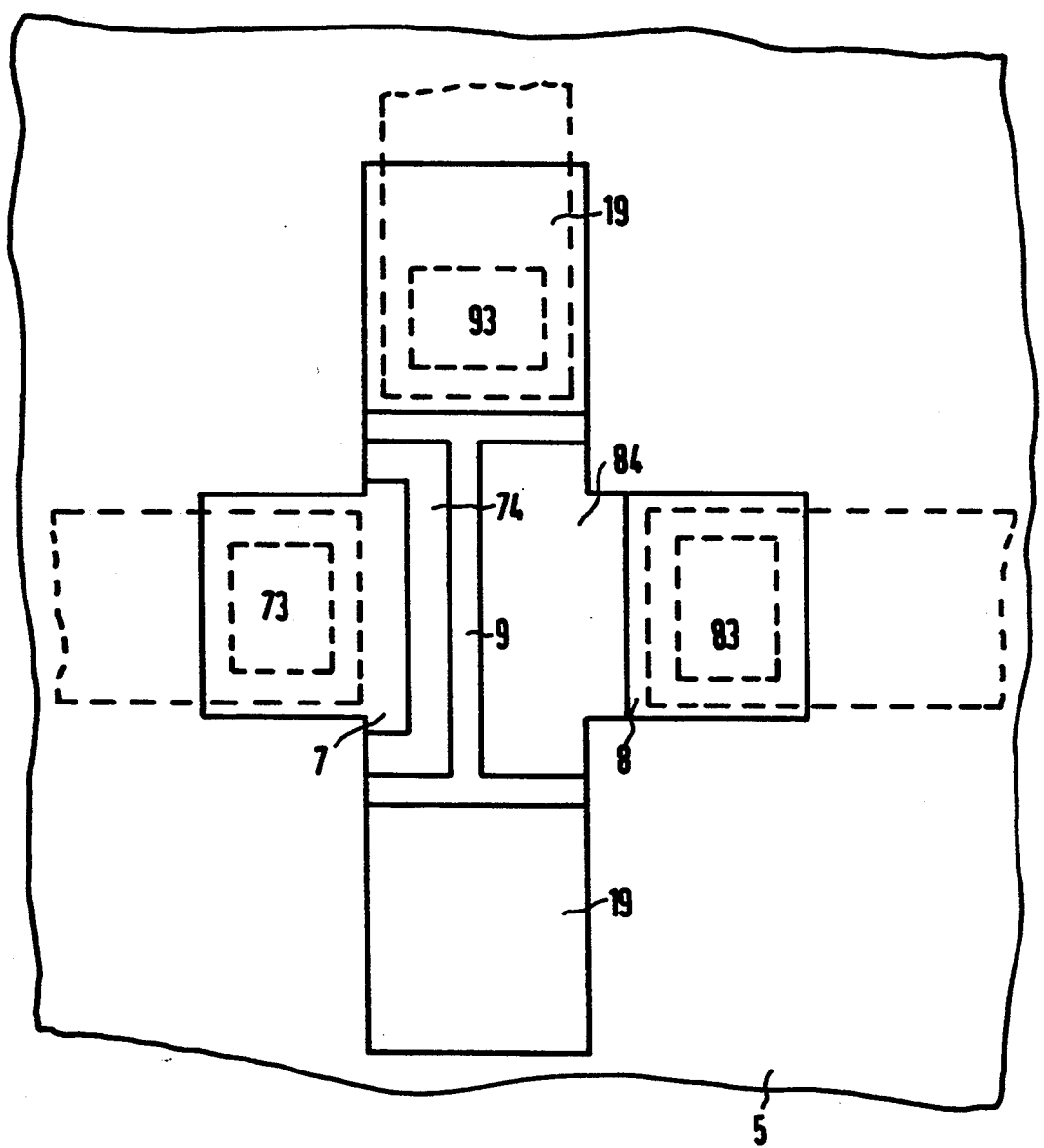
FIG. 5 shows a section of an inventively manufactured transistor of the invention illustrated in FIG. 6.

The arrangement of the emitter zone 7, the further emitter zone 74, the base zone 9, the collector zone 8, the further collector zone 84 and the base terminal zone 19 is shown in FIG. 5. This FIG. 5 shows the section at the level of the silicon layer 3 illustrated in FIG. 6. The contacts and metallizations are indicated by broken lines in FIG. 5. These contactings are produced in that the auxiliary layer 11, potentially the second auxiliary layer 12, and the dielectric layer 10 are structured, i.e. are provided with via holes, by using a phototechnique. As warranted, a further dielectric layer, which is illustrated in FIGS. 7, 8 and 9 as planarization layer 14, can be previously applied in order to planarize the surface. The leveling of the surface of this planarization layer 14 can occur by polishing or by allowing the heated layer to flow. The metal contacts 73 for the emitter and 83 for the collector are applied into these via holes together with the metal contact for the base. For example, a metallization of TiN/AlSiCu or TiN/W/AlSiCu can be employed for these metal contacts.

In the method of the invention, emitter, base and collector can also be first contacted with doped polysilicon and can then be subsequently contacted with metal. In the example of FIG. 7, a contact layer 71 of polysilicon is located only on the emitter zone 7 as an example. The planarization layer 14 is initially present surface-wide and is then removed together with the auxiliary layer 11, potentially the second auxiliary layer 12 and together with the dielectric layer 10 in the region of the via holes. These via holes are filled with the metal contacts 73 for the emitter, 83 for the collector and for the base (plug technique). The planar surface is then provided with metallizations 72 for the emitter terminal and 82 for the collector and with a corresponding metallization for the base terminal, being provided therewith on the surface. This metallization level, for example, can be formed by interconnects.

In this exemplary embodiment, the contact layer 71 can be omitted, whereby the metal contact 73 for the emitter is then directly applied on the emitter zone 7, or a second contact layer of polysilicon can be produced between the collector zone 8 and the metal contact 83 for the collector. By contrast to the embodiment of FIG. 6, a planar surface is then obtained.

As initially mentioned, the insulation of the individual transistors from one another in the method of the invention can also occur by removing the silicon layer 3 outside of the provided transistor regions up to the insulation layer 2. It is possible to also laterally connect the transistor regions.

An especially advantageous embodiment of this structure is the manufacture of a lateral polysilicon emitter. This embodiment is shown in FIG. 8. Laterally relative to the emitter zone 7, the corresponding part of the silicon layer 3 has been completely removed here and the contact layer 71 of polysilicon is applied directly onto the insulation layer 2 such that it laterally contacts the emitter zone 7. As in the exemplary embodiment of FIG. 7, the metal contact 73 for the emitter is located on this contact layer 71, this metal contact 73 being again produced with the plug technique in a via hole of the planarization 14 and being provided on the upper side with a metallization 72 for the emitter terminal.

In this exemplary embodiment, the connecting version without a separate contact layer of polysilicon is also shown at the collector side. Such a polysilicon layer can also be produced at the collector side between the collector zone 8 and metal contact 83 for the collector. The insulation region 5 can also be removed at the collector side, and the contact layer can be applied on the insulation layer laterally relative to the collector zone 8. As an alternative to the example of FIG. 8, the contact layer 71 can laterally contact the emitter zone 7 and on the upper side. The auxiliary layer 11 and, potentially, the second auxiliary layer 12 are then removed in the region of the upper side of the emitter zone 7 and the contact layer 71 of polysilicon is correspondingly laterally applied and on this free upper side of the emitter zone 7. The metal contact 73 for the emitter can then be applied on the part of the polysilicon layer present over the emitter zone 7. The depth of the via hole is then correspondingly less by the height of the emitter zone 7.

As already mentioned, the second auxiliary layer 12 can be omitted in all of these alternative embodiments. The emitter zone 7 then directly adjoins the base zone 9. In the corresponding implantation step for the emitter zone 7, the dose of the doping must then be correspondingly increased in order to enable a low-impedance contacting of the emitter zone 7.

In the method of the invention, a zone of lower doping can be produced both between the base zone 9 and the highly doped emitter zone 7, as well as between the base zone 9 and the further collector zone 84 provided as an active collector zone. A further auxiliary layer is required for this purpose. The more lightly doped zone between base zone 9 and emitter zone 7 is formed by the further emitter zone 74 that can be produced as set forth. A lightly doped zone having the operational sign of the conductivity of the base zone 9 or the collector zone 8 and that is arranged between this base zone 9 and the further collector zone 84 provided as an active collector zone is produced by using this further auxiliary layer as a primary auxiliary layer. After the structuring of the dielectric layer 10, that part of the region 4 left free by this dielectric layer 10 and having basic doping is first re-doped.

The height of the doping is selected in the same way as provided for the further lightly doped zone that adjoins the further collector zone 84. Given incomplete redoping, the further base zone to be manufactured has the conductivity type of the basic doping at a lower doping level (density of acceptors or, respectively, donors). Given complete re-doping, the further base zone to be produced has the same conductivity type as the actual base zone 9 but with less of a doping level. By using the primary auxiliary layer 13 having the thickness d3 that shields this further base zone 98 (see FIG. 9), the doping for the base zone 9 is then implanted. Following thereupon, one can proceed farther as set forth with the auxiliary layer 11 and with the second auxiliary layer 12. In this way, the structure of FIG. 9 results wherein, with reference to the example of an npn transistor, the conductivity types are as follows: emitter zone 7,$n^+$; further emitter zone 74, $n^-$; base zone 9, p; further base zone 98, $p^-$ or $n^-$; further collector zone 84, n; and collector zone 8, $n^+$. The same possibilities as set forth earlier are available for the contacting in this exemplary embodiment.

In the described versions, the base is respectively laterally drawn outward, i.e. the base zone 9 proceeds strip-shaped perpendicularly relative to the plane of the drawing and ends in a highly doped base terminal zone 19 (see FIG. 5) that serves as base terminal and is correspondingly contacted. The contacting itself can occur directly with metal or indirectly via a contact layer of polysilicon. By using the auxiliary layer 11 as shielding, the vertical part by the structured dielectric layer 10 and the base zone 9 can be produced very exactly with a small lateral dimension. The vertical dimension of the inventively manufactured transistor then results automatically from the thickness of the original silicon layer 3 of the SOI substrate used.

Although the invention has been described with respect to preferred embodiments, it is not to be so limited as changes and modifications can be made therein which are within the full intended scope as defined by the appended claims.

I claim:

1. Method for manufacturing a lateral bipolar transistor, comprising the steps of:

laterally electrically insulating a region for forming a transistor in a silicon layer located on an insulation layer, said region having a basic doping;

manufacturing a highly doped base terminal zone and a highly doped collector zone by implantation of dopants in said silicon layer using masks;

applying a structured dielectric layer having a selected thickness over said silicon layer to cover said base terminal zone and to cover a region for forming a collector, leaving free a region for a base zone and for an emitter zone, said structured layer having a vertical sidewall relative to a layer plane at a boundary between said covered region and said region left free, said structured layer having a selected thickness;

implanting a dopant in said base zone in said silicon layer having a first conductivity type using said dielectric layer as mask;

isotropically applying an auxiliary layer surface-wide over said structured dielectric layer with a thickness measured in the direction of emitter to collector that corresponds to the length for said base zone;

implanting a dopant in said emitter zone in said silicon layer having a second conductivity type to form a highly doped emitter zone using said auxiliary layer as shielding for said base zone;

producing via holes through said auxiliary layer and said dielectric layer respectively exposing said emitter zone, said base terminal zone, and said collector zone; and applying metal electrical contacts in said via holes to said emitter zone, base terminal zone and collector zone.

2. Method according to claim 1, wherein said step of implanting a dopant in said emitter zone in said silicon layer having a second conductivity type using said auxiliary layer as shielding for said base zone is further defined by setting the height of the doping for a further emitter zone to be produced between said highly doped emitter zone and said base zone;

said method further comprising the steps of:
isotropically applying a second auxiliary layer surface-wide over said auxiliary layer with a thickness that corresponds to the length of said further emitter zone measured in a direction from emitter to collector before said step of producing via holes;

implanting a dopant for said highly doped emitter zone by using said second auxiliary layer as shielding for said further emitter zone before said step of producing via holes; and producing a via hole through said auxiliary layer and said second auxiliary layer exposing said highly doped emitter zone.

3. Method according to claim 2, further comprising a step of:
applying a planarization layer of dielectric over said second auxiliary layer to level the surface before said step of producing via holes.

4. Method according to claim 1, wherein said step of laterally electrically insulating a region for forming a transistor in a silicon layer located on an insulation layer is further defined by:
producing the basic-doping for the conductivity type of the collector; and wherein said step of applying a structured dielectric layer is further defined by applying said dielectric layer over said silicon layer to cover a region having said basic doping to provide a further collector zone located between said highly doped collector zone and said base zone to be produced.

5. Method according to claim 1, wherein said step of implanting a dopant in said base zone in said silicon layer having a first conductivity type using said dielectric layer as mask is further defined by setting the height of the doping for a further base zone to be produced between a highly doped base zone and said collector zone; and said method further comprising the steps of:
isotopically applying a primary auxiliary layer surface-wide over said dielectric layer with a thickness that corresponds to the length of said further base zone measured in the direction from emitter to collector before said step of isotrpically applying said auxiliary layer; and implanting a dopant for said highly doped base zone by using said primary auxiliary layer as shielding for said further base zone before said step of isotropically applying an auxiliary layer.

6. Method according to claim 1, further comprising the steps of:
uncovering said emitter zone in a region provided for electrical connection; and applying a contact layer of polysilicon thereon before said step of producing via holes.

7. Method according to claim 6, wherein said step of uncovering said emitter zone in a region provided for electrical connection is further defined by providing said region with at least one lateral limitation of said emitter zone, and wherein said step of applying a contact layer of polysilicon is further defined by applying said contact layer such that it adjoins said emitter zone at said uncovered at least one lateral limitation of said emitter zone.

8. Method according to claim 1, wherein said step of isotropically applying an auxiliary layer is further defined by isotropically applying a tetraethylorthosilicate (TEOS) auxiliary layer.

9. Method according to claim 1, wherein said step of laterally electrically insulating a region for forming a transistor in a silicon layer located on an insulating layer is further defined by laterally electrically insulating a region for forming a transistor in an SOI substrate.

* * * * *